(12) United States Patent
Kaida

(10) Patent No.: US 12,072,352 B2
(45) Date of Patent: Aug. 27, 2024

(54) INSPECTION JIG AND INSPECTION DEVICE

(71) Applicant: NIDEC-READ CORPORATION, Kyoto (JP)

(72) Inventor: Michio Kaida, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 161 days.

(21) Appl. No.: 17/636,901

(22) PCT Filed: Aug. 8, 2020

(86) PCT No.: PCT/JP2020/032338
§ 371 (c)(1),
(2) Date: Feb. 21, 2022

(87) PCT Pub. No.: WO2021/039898
PCT Pub. Date: Mar. 4, 2021

(65) Prior Publication Data
US 2022/0357362 A1    Nov. 10, 2022

(30) Foreign Application Priority Data
Aug. 28, 2019  (JP) .................................. 2019-155225

(51) Int. Cl.
*G01R 31/28*    (2006.01)
*G01R 1/073*    (2006.01)

(52) U.S. Cl.
CPC ..... *G01R 1/07314* (2013.01); *G01R 31/2831* (2013.01)

(58) Field of Classification Search
CPC .................. G01R 1/07307; G01R 1/07342
See application file for complete search history.

(56) References Cited

U.S. PATENT DOCUMENTS

| | | | |
|---|---|---|---|
| 10,649,005 B2 | 5/2020 | Ota | |
| 2009/0174422 A1 | 7/2009 | Machida | |
| 2019/0261514 A1* | 8/2019 | Nasu | ...................... H05K 3/429 |
| 2019/0265276 A1 | 8/2019 | Ota | |

FOREIGN PATENT DOCUMENTS

| | | | | |
|---|---|---|---|---|
| JP | 2004069485 A | | 3/2004 | |
| JP | 2006038457 A | | 2/2006 | |
| JP | 2008026027 A | | 2/2008 | |
| JP | 2018132515 A | | 8/2018 | |
| JP | 2019066449 A | | 4/2019 | |
| JP | 2019090775 A | | 6/2019 | |
| KR | 20080082670 A | * | 9/2008 | ......... G01R 31/2889 |

* cited by examiner

Primary Examiner — Tung X Nguyen
(74) Attorney, Agent, or Firm — Viering, Jentschura & Partner mbB

(57) ABSTRACT

An inspection jig includes: film-shaped wiring substrates each having one surface provided with an electrode; a pedestal that supports the wiring substrates which are laminated such that electrode regions are exposed, the electrode region being a region where the electrode is provided in each of the wiring substrates; and a plurality of probes which have base end portions in contact with the electrode regions and extend in a direction away from the electrode regions.

20 Claims, 12 Drawing Sheets

INSPECTION JIG AND INSPECTION DEVICE

CROSS-REFERENCE TO RELATED APPLICATIONS

This is a U.S. National Stage Application, filed under 35 U.S.C. § 371 of International Patent Application No. PCT/JP2020/032338, filed on Aug. 27, 2020, and claims priority under 35 U.S.C. § 119(a) and 35 U.S.C. § 365(b) from Japanese Patent Application No. 2019-155225, filed on Aug. 28, 2019; the disclosures of which are incorporated herein by reference.

FIELD

The present disclosure relates to an inspection jig, and an inspection device for use in an inspection.

BACKGROUND

Conventionally, there is known an inspection device that inspects an inspection target such as a print wiring substrate or a semiconductor substrate by bringing a plurality of probes arranged in a multi-needle shape into contact with a plurality of inspection points of the inspection target. In addition, there is known an inspection jig including a jig head that holds such multi-needle shaped probes and electrically connecting the probes and an inspection device body.

Incidentally, in recent years, the pitch of the inspection points has become considerably fine, and the number of inspection points has also increased. Therefore, it is not uncommon that the number of probes is about several thousands. On the other hand, connection terminals on the inspection device body side are necessarily formed into a large shape to some extent from the viewpoint of ease of manufacturing, connection reliability, and durability, and are arranged at intervals wider than the arrangement intervals of the inspection points. Therefore, these probes cannot be directly connected to the inspection device body.

In this regard, there is known a conversion block including first electrodes which are arranged to be in contact with rear end portions of the probes arranged corresponding to the inspection points, and second electrodes which are arranged at wider intervals than those of the first electrodes and easily connected to the inspection device body. In the conversion block described above, a wire connecting the first electrode and the second electrode is formed to penetrate the conversion block. There is known an inspection jig that facilitates the connection between the probe and the inspection device body by using such a conversion block.

Such a conversion block can be produced, for example, by laminating a plurality of connection substrates each having a via penetrating the substrate and a wire extending in a plane direction of the substrate.

Incidentally, in the conversion block described above, it is necessary to expand the arrangement interval of the first electrodes arranged corresponding to the inspection points arranged at an extremely short interval to an interval allowing the connection to the inspection device body. Therefore, it is necessary to precisely laminate a large number of connection substrates in which the interval between the vias is gradually expanded, and a high technique is required to manufacture an inspection jig using such a conversion block.

An exemplary inspection jig according to the present disclosure includes: a plurality of film-shaped wiring substrates each having one surface provided with an electrode; a pedestal that supports the plurality of wiring substrates which are laminated such that electrode regions are exposed, the electrode region being a region where the electrode is provided in each of the wiring substrates; and a plurality of probes which have base end portions in contact with the electrode regions and extend in a direction away from the electrode regions.

Further, an exemplary inspection device according to the present disclosure includes the inspection jig described above and an inspection processing portion that performs an inspection of an inspection target on the basis of an electrical signal obtained by bringing the probe into contact with an inspection point provided on the inspection target.

The above and other elements, features, steps, characteristics and advantages of the present disclosure will become more apparent from the following detailed description of the preferred embodiments with reference to the attached drawings.

BRIEF DESCRIPTION OF THE DRAWINGS

In the drawings, like reference characters generally refer to the same parts throughout the different views. In the drawings, components given the same reference numerals denote the same components, and description thereof will be omitted. The drawings are not necessarily to scale, emphasis instead generally being placed upon illustrating the principles of the disclosed embodiments. In the following description, various embodiments described with reference to the following drawings, in which.

DETAILED DESCRIPTION

Hereinafter, an embodiment of the present disclosure will be described with reference to the accompanying drawings.

Figure 1:
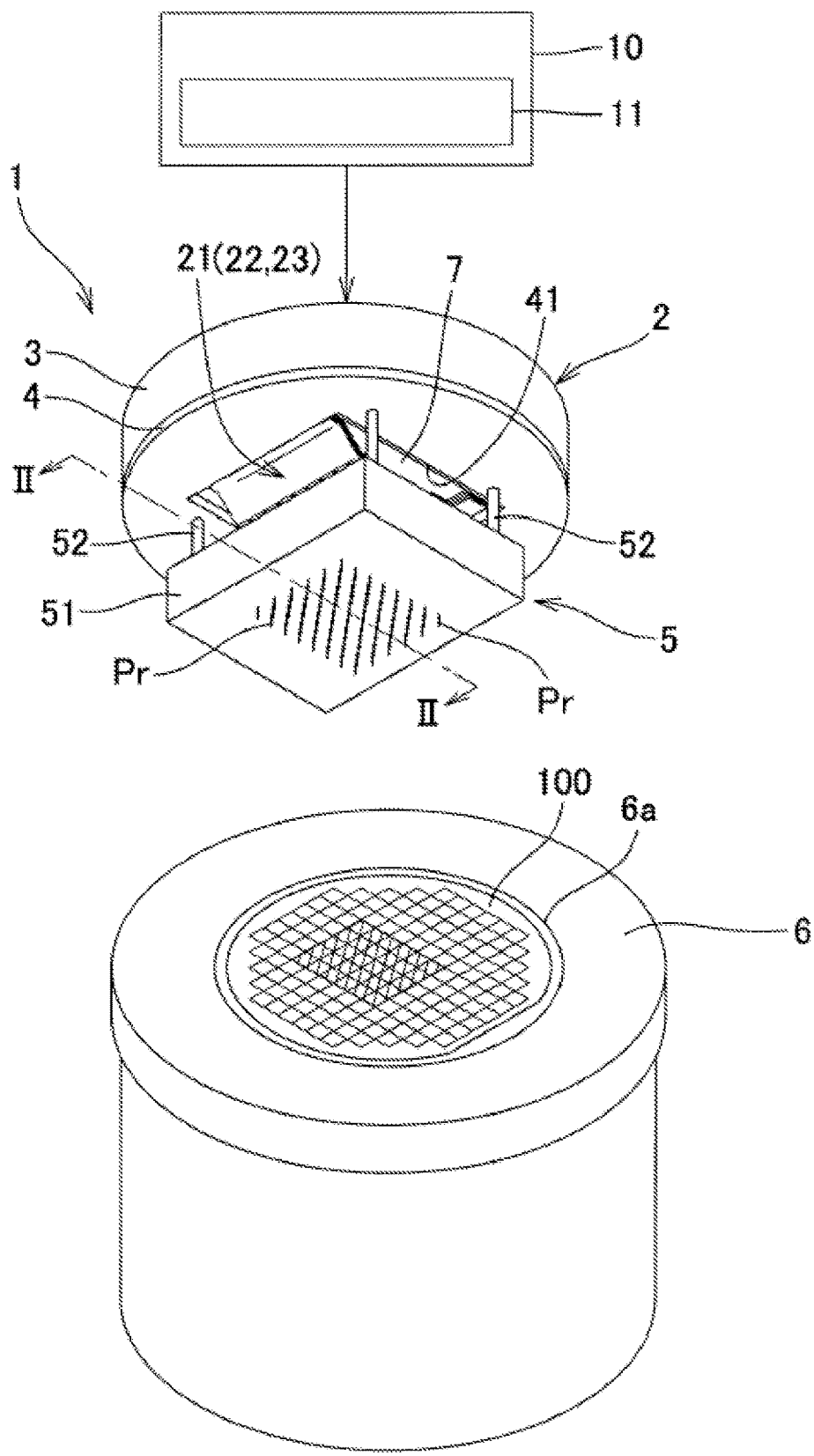
FIG. 1 is a conceptual diagram schematically illustrating a configuration of an inspection device provided with an inspection jig according to an exemplary embodiment of the present disclosure.
Figure 2:
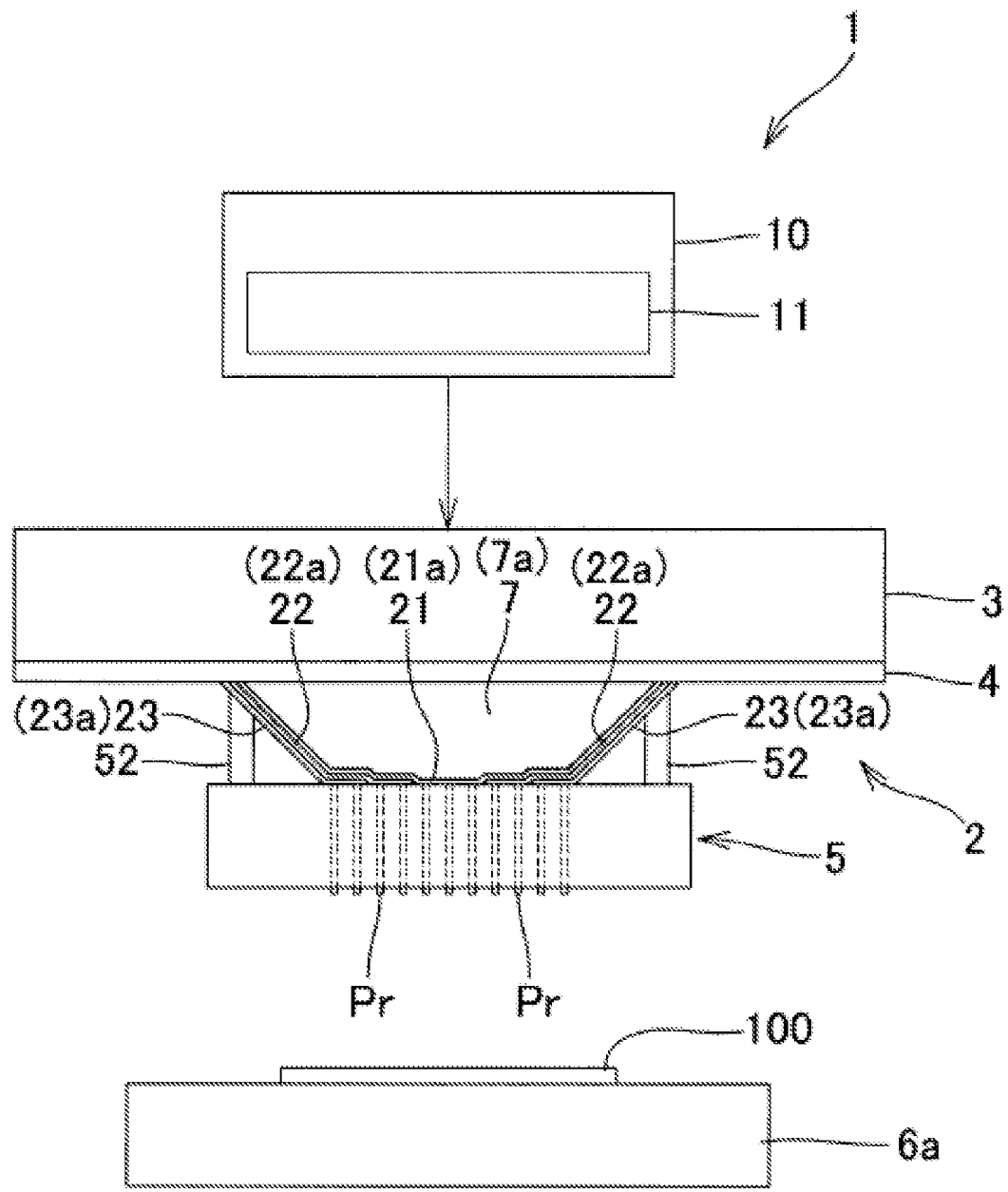
FIG. 2 is a conceptual cross-sectional view taken along line II-II illustrating the inspection jig and a sample platform of the inspection device illustrated in FIG. 1.

Note that in the drawings, components with the same reference numerals denote the same components, and description thereof will be omitted. An inspection device 1 illustrated in FIG. 1 is an inspection device for inspecting a circuit that is formed on a semiconductor wafer which is an example of an inspection target 100. In FIG. 2, the description of a sample platform 6 is simplified.

In the inspection target 100, circuits corresponding to a plurality of semiconductor chips are formed, for example, on a semiconductor substrate of a silicon or the like. Note that the inspection target may be an electronic component such as a semiconductor chip, a chip size package (CSP), or a semiconductor element (integrated circuit (IC)) or another target on which electrical inspection is performed.

Also, the inspection device is not limited to a semiconductor inspection device and may be a substrate inspection device that inspects a substrate, for example. The substrate that is the inspection target 100 may be, for example, a substrate such as a print wiring substrate, a glass epoxy substrate, a flexible substrate, a ceramic multilayered wiring substrate, a package substrate for a semiconductor package, an interposer substrate, or a film carrier, an electrode panel for a display such as a liquid crystal display, an electroluminescence (EL) display, or a touch panel display, an electrode panel for a touch panel, or substrates of various kinds.

The inspection device 1 illustrated in FIGS. 1 and 2 includes an inspection jig 2, a sample platform 6, and an inspection device body 10. A placement portion 6a on which the inspection target 100 is placed is provided on the upper surface of the sample platform 6. The sample platform 6 is configured to fix the inspection target 100 to be inspected at a predetermined position. The inspection device body 10 includes an inspection processing portion 11. In addition, the inspection device body 10 includes components necessary for inspection, such as a scanner unit and a driving mechanism (not illustrated).

The scanner unit is a switching circuit configured using a switching element such as a transistor or a relay switch. The scanner unit switches a connection relationship between the inspection processing portion 11 and a probe Pr to be described later. The driving mechanism moves the inspection jig 2 to bring the probe Pr into contact with or separate from the inspection point.

The placement portion 6a is configured to be able to be lifted and lowered and is configured to enable the inspection target 100 accommodated in the sample platform 6 to be lifted to an inspection position and enable the inspection target 100 after the inspection to be stored in the sample platform 6, for example. Also, the placement portion 6a is configured to enable the inspection target 100 to rotate and orient an orientation flat to a predetermined direction, for example. Also, the inspection device 1 includes a transport mechanism such as a robot arm, which is not illustrated in the drawing. By the transport mechanism, the inspection target 100 is placed on the placement portion 6a, and the inspected inspection target 100 is transported from the placement portion 6a.

The inspection jig 2 includes a base portion 3 having a substantially disk shape, a cover member 4 attached to the base portion 3 so as to cover one surface of the base portion 3, and a jig head 5 attached so as to protrude from a substantially central portion of the cover member 4. The jig head 5 holds a plurality of probes Pr in a multi-needle shape. The inspection jig 2 is a jig for performing an inspection by bringing a plurality of probes Pr into contact with the inspection target 100, and for example, the inspection jig is configured as a so-called probe card.

A plurality of chips are formed in the inspection target 100. A plurality of inspection points such as pads and bumps are formed in each of the chips. Corresponding to a partial region of the plurality of chips formed in the inspection target 100 (for example, the hatched region in FIG. 1; hereinbelow, referred to as an inspection region), the inspection jig 2 holds the plurality of probes Pr such that the probes Pr correspond to the respective inspection points in the inspection region.

When the probes Pr have been brought into contact with the respective inspection points in the inspection region, and the inspection in the inspection region is finished, the placement portion 6a lowers the inspection target 100, the sample platform 6 moves in parallel and causes the inspection region to move, the placement portion 6a causes the inspection target 100 to be lifted, and an inspection is then performed by bringing the probes Pr into contact with a new inspection region. In this manner, the entire inspection target 100 is inspected by performing the inspection while causing the inspection region to sequentially move.

Note that FIGS. 1 and 2 are explanatory diagrams schematically and conceptually illustrating an example of the configuration of the inspection device 1 from the viewpoint of allowing easy understanding of embodiments of the present disclosure, and the number, the density, and the arrangement of the probes Pr, the shapes of and the size ratios between the respective portions of the inspection jig 2 and the sample platform 6, and the like are also illustrated in a simple and conceptual manner. For example, the inspection region is illustrated in an enlarged and emphasized manner as compared with a typical semiconductor inspection device in terms of easy understanding of the arrangement of the probes Pr, and the inspection region may be smaller or larger.

Although the example in which the inspection jig 2 is arranged above the inspection target 100 has been described, the inspection jig 2 may be arranged below the inspection target 100, the inspection jigs 2 may be arranged above and below the inspection target 100, or the inspection target 100 and the inspection jig 2 may be arranged to face each other in a horizontal direction. For convenience, in each drawing, as viewed from the inspection jig 2, a direction in which the inspection target 100 is arranged is described as "downward", and a direction opposite to the inspection target 100 is described as "upward", and vertical and horizontal directions are described with reference to the downward and upward directions.

Figure 3:
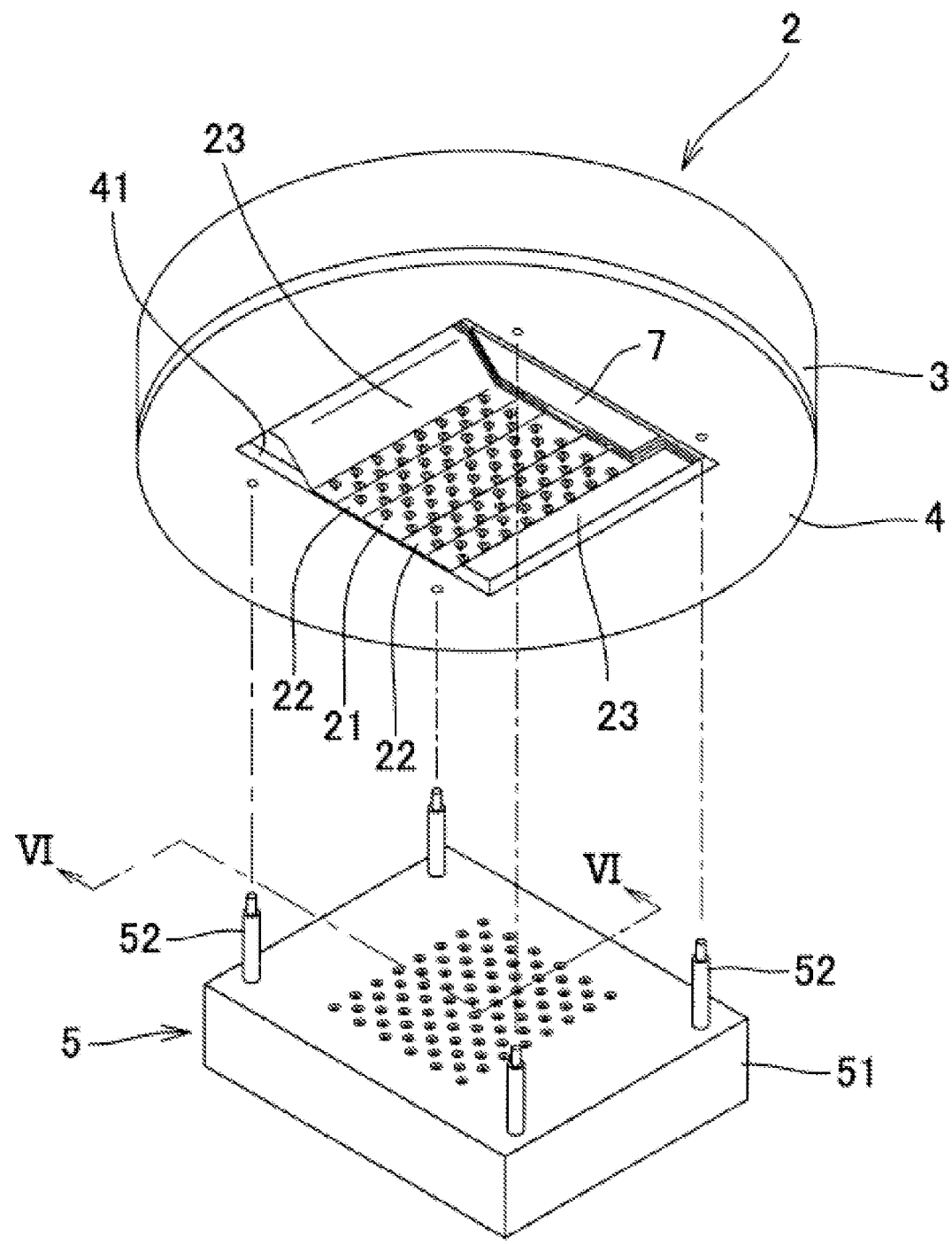
FIG. 3 is an exploded perspective view illustrating a state where a jig head is removed from the inspection jig.

Referring to FIG. 3, a substantially rectangular opening portion 41 is formed in a substantially central portion of the cover member 4. A pedestal 7 protruding in a substantially trapezoidal shape is provided in a substantially central portion of the base portion 3. The pedestal 7 protrudes downward from the opening portion 41. Film-shaped wiring substrates 21, 22, and 23 having flexibility are laminated on the lower surface of the pedestal 7. The pedestal 7 is made of, for example, a resin material.

The jig head 5 includes the plurality of probes Pr, a support member 51 that supports the plurality of probes Pr to extend from the wiring substrates 21, 22, and 23 in a multi-needle shape, and for example, four supports 52 that connect the support member 51 to the cover member 4.

Figure 4:
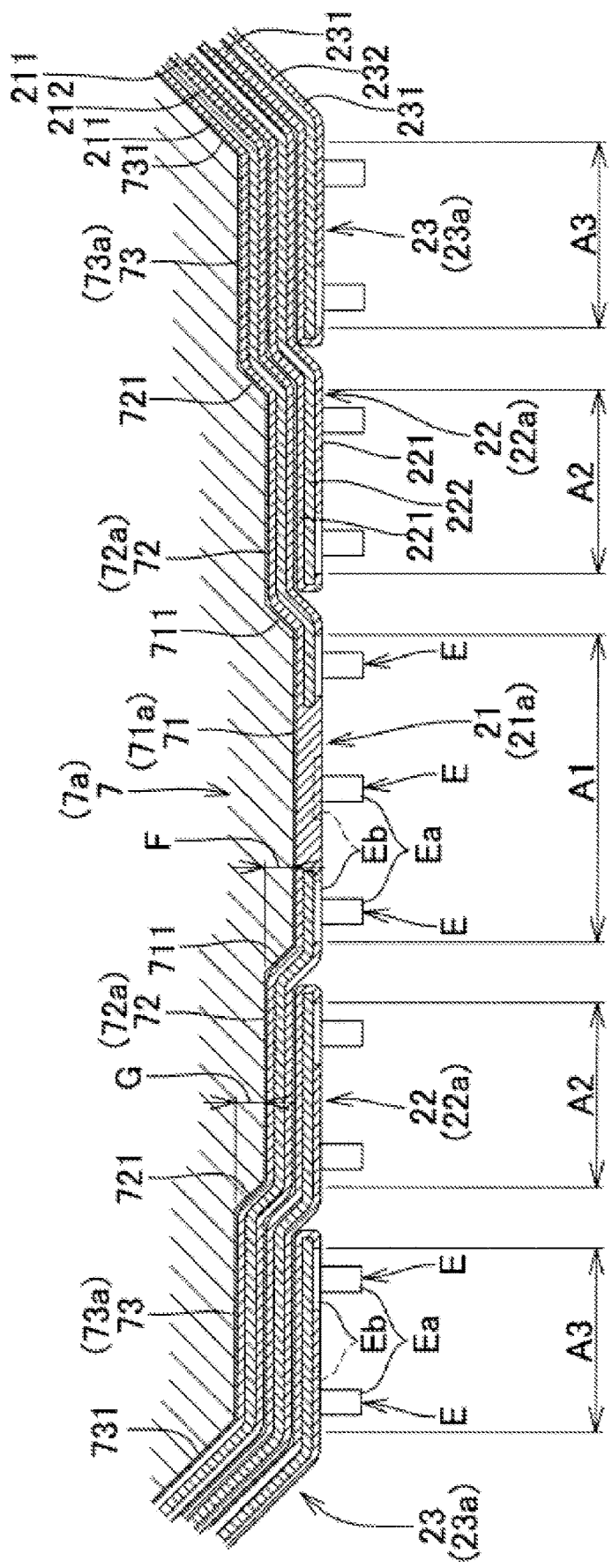
FIG. 4 is a partially enlarged view (cross-sectional view) illustrating a vicinity of an apex portion of a pedestal.
Figure 5:
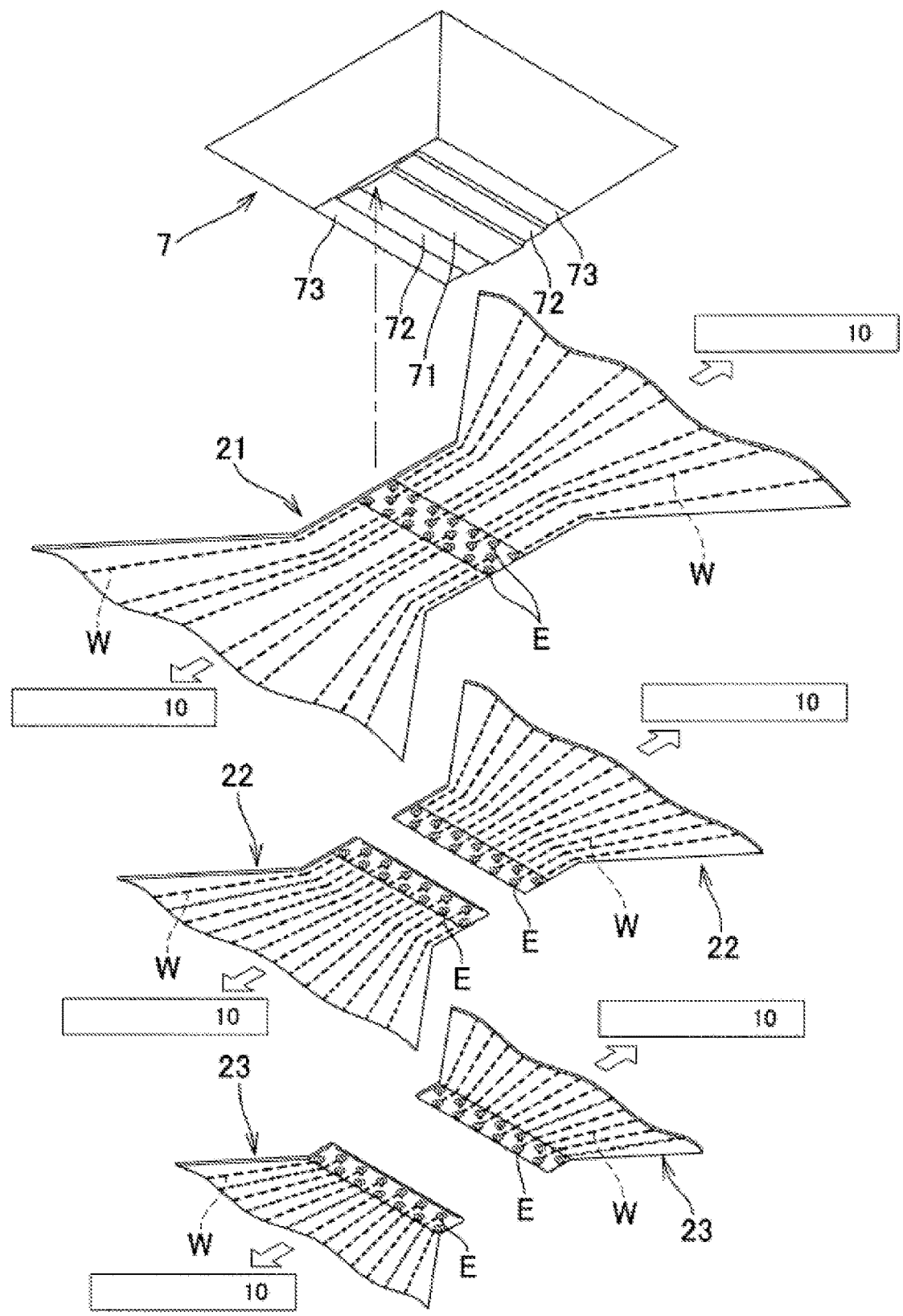
FIG. 5 is an exploded perspective view of the pedestal and a wiring substrate illustrated in FIG. 3.

Referring to FIGS. 4 and 5, stepwise step portions 71, 72, and 73 are formed in the vicinity of the apex portion of the pedestal 7. The step portion 71 corresponds to the apex portion of the uppermost stage of the pedestal 7. The step portions 72 and 73 are formed on both sides of the step portion 71. The step portions 71, 72, and 73 face downward and are substantially flat.

The step portion 72 is a step subsequent to the step portion 71, and is continuous with the step portion 71 at a slope 711. The step portion 73 is a step subsequent to the step portion 72, and is continuous with the step portion 72 at a slope 721. The side of the step portion 73 opposite to the step portion 72 is continuous with a slope 731 extending from the base portion of the pedestal 7.

The wiring substrates 21, 22, and 23 are, for example, so-called flexible substrates. The wiring substrates 21, 22, and 23 have a substantially belt-like shape extending in a step direction (a first direction and a right and left direction in FIG. 4) of the step portions 71, 72, and 73. The wiring substrates 21, 22, and 23 have substantially the same thickness.

The wiring substrate 21 includes a wiring layer 212, insulating layers 211 and 211 covering both surfaces of the wiring layer, and a plurality of electrodes E. Each of the plurality of electrodes E is conductively connected to each of a plurality of wires W included in the wiring layer 212.

The wiring substrate 21 is attached to the slope 731, the step portion 73, the slope 721, the step portion 72, the slope 711, and the step portion 71 to cover the entire lower surface of the pedestal 7. The wiring substrate 21 is attached to the pedestal 7 by using, for example, an adhesive, and an adhesive layer (not illustrated) using the adhesive is formed between the wiring substrate 21 and the lower surface of the pedestal 7.

An electrode E connected to a wire W extending from the right side to the vicinity of the center in FIG. 4 and an electrode E connected to a wire W extending from the left side to the vicinity of the center in FIG. 4 are provided on the lower surface of an electrode region A1 in the substantially central portion of the wiring substrate 21. The upper surface of the electrode region A1 is attached to the step portion 71, that is, the apex portion of the pedestal 7. The electrodes E in the electrode region A1 are formed in three rows in a staggered arrangement, for example, in rows in the depth direction of a paper surface in FIG. 4.

Note that although the example in which the pedestal 7 is covered with one (series of) wiring substrate 21 has been described, the wiring substrate 21 may be separated, for example, in the vicinity of the center of the electrode region A1, and the pedestal 7 may be covered with two wiring substrates 21. In addition, the number of rows of the electrodes E formed in the electrode region A1 may be more than three, and may be one or two. In addition, the arrangement may not be the staggered arrangement.

The wiring substrate 22 includes a wiring layer 222, insulating layers 221 and 221 covering both surfaces of the wiring layer, and a plurality of electrodes E. Each of the plurality of electrodes E is conductively connected to each of the plurality of wires W included in the wiring layer 222. The wiring substrate 22 which covers the pedestal 7 from the right side of FIG. 4 and the wiring substrate 22 which covers the pedestal 7 from the left side of FIG. 4 are provided.

The wiring substrate 22 is laminated and attached to the portion where the wiring substrate 21 is attached to the slope 731, the step portion 73, the slope 721, and the step portion 72. The wiring substrate 22 is attached to the wiring substrate 21 by using, for example, an adhesive, and an adhesive layer (not illustrated) using the adhesive is formed between the wiring substrate 21 and the wiring substrate 22.

On the lower surface of an electrode region A2 provided in the vicinity of one end portion of the wiring substrate 22, an electrode E connected to a wire extending from the other end portion of the wiring substrate 22 is provided. The upper surface of the electrode region A2 is attached to the wiring substrate 21 attached to the step portion 72. In this manner, the electrode region A2 is attached to the step portion 72.

The electrodes E in the electrode region A2 are formed in two rows in a staggered arrangement, for example, in rows in the depth direction of the paper surface in FIG. 4.

The wiring substrate 23 includes a wiring layer 232, insulating layers 231 and 231 covering both surfaces of the wiring layer, and a plurality of electrodes E respectively conductively connected to a plurality of wires W included in the wiring layer 232. The wiring substrate 23 which covers the pedestal 7 from the right side of FIG. 4 and the wiring substrate 23 which covers the pedestal 7 from the left side of FIG. 4 are provided.

The wiring substrate 23 is laminated and attached to the portion where the wiring substrate 22 is attached to the slope 731 and the step portion 73. The wiring substrate 23 is attached to the wiring substrate 22 by using, for example, an adhesive, and an adhesive layer (not illustrated) using the adhesive is formed between the wiring substrate 22 and the wiring substrate 23.

An electrode E connected to a wire extending from the other end portion of the wiring substrate 23 is provided on the lower surface of an electrode region A3 provided in the vicinity of one end portion of the wiring substrate 23. The upper surface of the electrode region A3 is attached to the wiring substrate 22 attached to the step portion 73. In this manner, the electrode region A3 is attached to the step portion 73.

The electrodes E in the electrode region A3 are formed in two rows in a staggered arrangement, for example, in rows in the depth direction of the paper surface in FIG. 4.

Note that the number of rows of the electrodes E formed in the electrode regions A2 and A3 may be more than two or may be one. In addition, the arrangement may not be the staggered arrangement. In addition, although the example in which the three wiring substrates 21, 22, and 23 are laminated on the pedestal 7 has been described, the number of the wiring substrates to be laminated may be two or more than three.

The electrode E includes an electrode base portion Eb electrically connected to each wire W of the wiring substrates 21, 22, and 23 and a substantially cylindrical projection portion Ea protruding downward from the electrode base Eb. As a method of forming the electrode E, for example, various methods such as a method described in JP 2006-38457 A and a method based on a micro electro mechanical systems (MEMS) technology can be used.

As illustrated in FIG. 4, the wiring substrate 21, that is, one wiring substrate is attached to the step portion 71, the wiring substrates 21 and 22, that is, two wiring substrates are laminated on the step portion 72, and the wiring substrates 21, 22, and 23, that is, three wiring substrates are laminated on the step portion 73. Here, a step F of the step portions 71 and 72 and a step G of the step portions 72 and 73 are substantially equal to the thicknesses of the wiring substrates 21, 22, and 23, that is, correspond to the thickness of one wiring substrate.

As a result, in the electrode regions A1, A2, and A3 corresponding to the step portions 71, 72, and 73, the surface of the wiring substrate of the outermost surface is positioned in the same plane, and the electrodes E in the electrode regions A1, A2, and A3 are also positioned in the same plane.

As illustrated in FIG. 3, even the lowest step portion 73 of the pedestal 7 protrudes downward from the surrounding cover member 4. In this manner, the electrodes E in the electrode regions A1, A2, and A3 protrude from the surrounding cover member 4. Therefore, when the jig head 5 is attached to the electrode regions A1, A2, and A3, the cover member 4 and the like around the electrode regions A1, A2, and A3 do not interfere with the jig head 5, so that the jig head 5 can be easily attached to the electrode regions A1, A2, and A3.

Referring to FIG. 5, the wires W to be connected to respective electrodes E of the wiring substrates 21, 22, and 23 are connected to the inspection device body 10 with the interval between the wires expanded from the interval between the electrodes E. Since the wiring substrates 21, 22, and 23 are film-shaped, so-called flexible substrates, it is easy to expand the wiring interval.

The wires W of which the interval is expanded in the wiring substrates 21, 22, and 23 are connected to the inspection processing portion 11 in the inspection device body 10, for example, via the above-described scanner unit or directly. The adjacent interval of the electrodes E is equal to the adjacent interval of the probes Pr, and the adjacent interval of the probes Pr is equal to the minute adjacent interval of the inspection points 101.

On the other hand, according to the wiring substrates 21, 22, and 23, it is possible to easily expand the adjacent interval of the wires W from the adjacent interval of the electrodes E. In addition, in the wires W with the expanded adjacent interval, it is easy to connect the wires to the inspection device body 10 by using a connection means such as a connector.

That is, in the inspection jig 2, it is easy to expand the interval between the electrodes E to be connected to the multi-needle probes Pr to an interval allowing the connection to the inspection device body 10.

In the flexible substrate, it is difficult to wire the wires W in multiple layers. Therefore, when the adjacent interval of the electrodes E is small, and the number of rows of the electrodes E increases, it becomes difficult to form the wire W. However, according to the inspection jig 2, the plurality of wiring substrates 21, 22, and 23 can be laminated to wire the wires W in multiple layers, and thus it is easy to reduce the adjacent interval of the electrodes E and increase the number of the electrodes E.

Figure 6:
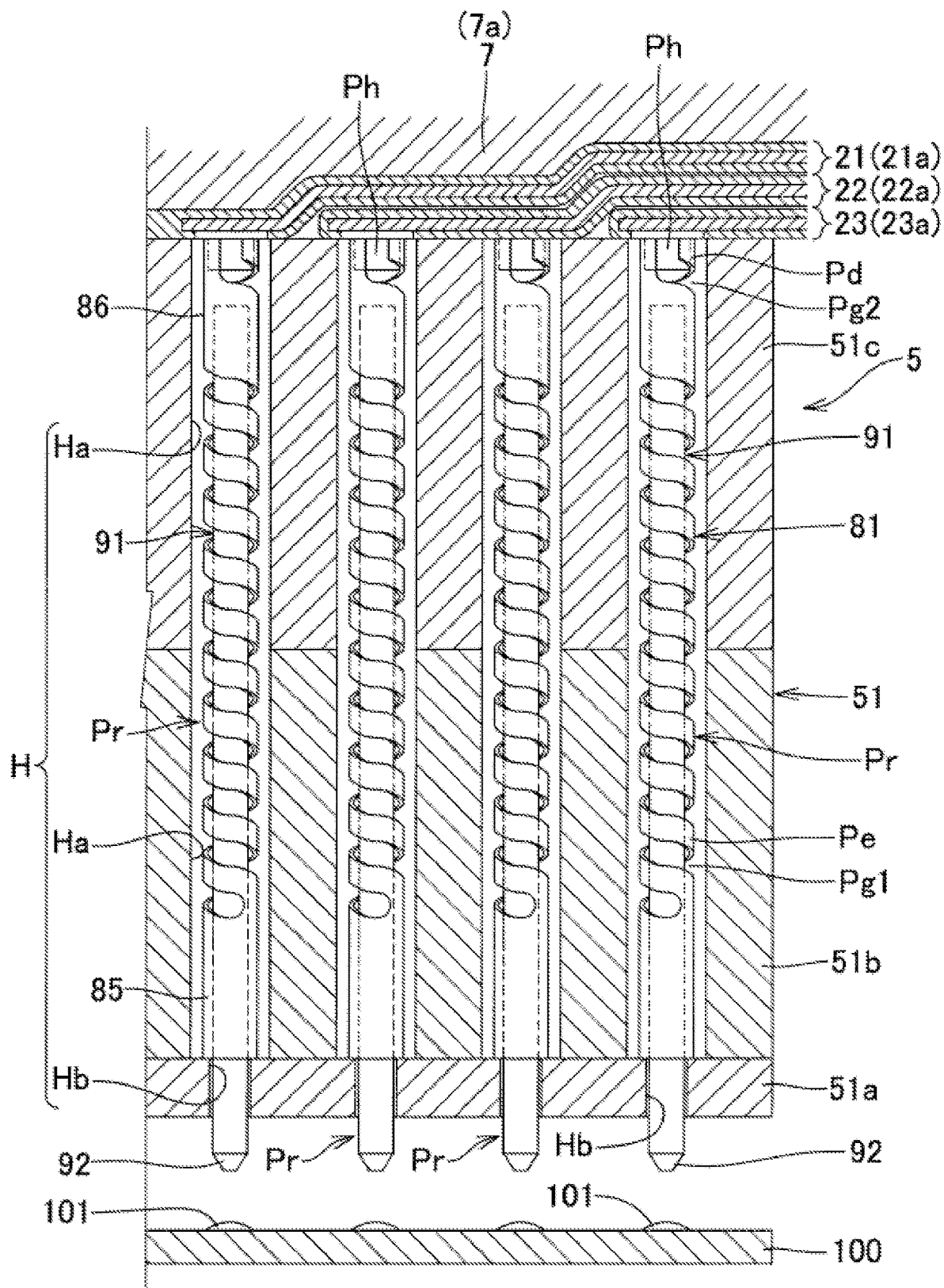
FIG. 6 is an enlarged partial cross-sectional view taken along line VI-VI illustrating a state where the wiring substrate and the jig head are connected.

Referring to FIG. 3, the support member 51 has a substantially rectangular parallelepiped shape which is flat in the vertical direction. The support member 51 illustrated in the partial cross-sectional view of FIG. 6 is configured by, for example, laminating plate-shaped support plates 51a, 51b, and 51c. The support plate 51a, which is positioned on the lower side in FIG. 6, is disposed on a front end side of the support member 51, while the support plate 51c, which is positioned on the upper side in FIG. 6, is disposed at a rear end side of the support member 51. In addition, a plurality of through-holes H are formed to pass through the support plates 51a, 51b, and 51c.

Each of the support plates 51b and 51c includes insertion hole portions Ha each of which is defined by an opening hole having a predetermined diameter. The support plate 51a includes through-holes each of which is defined by a small diameter portion Hb having a diameter smaller than that of each insertion hole portion Ha. In addition, the insertion hole portion Ha in the support plate 51c, the insertion hole portion Ha in the support plate 51b, and the small diameter portion Hb in the support plate 51a communicate with each other to form the through-hole H.

Note that the support member 51 may be configured such that the through-hole including the insertion hole portion Ha and the small diameter portion Hb is provided in an integrated member without being limited to the configuration in which the plate-shaped support plates 51a, 51b, and 51c are laminated. The entire through-hole may alternatively be defined by the insertion hole portion Ha having the predetermined diameter, with the small diameter portion Hb of a smaller diameter being omitted. Also note that, in place of the example in which the support plates 51b and 51b of the support member 51 are laminated on each other, the configuration may be made such that the support plates 51b and 51c in the state of being separated from each other are connected by, for example, a support or the like.

Figure 7:
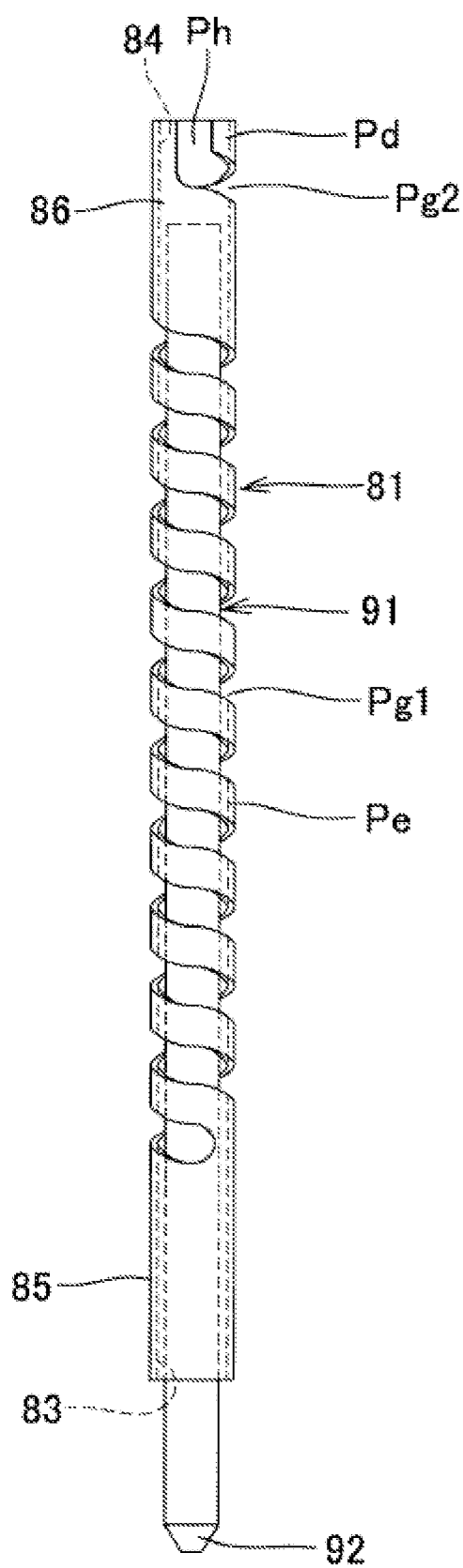
FIG. 7 is a plan view illustrating an example of a specific configuration of a probe.

At least a part of the probe Pr is accommodated in the through-hole H configured as described above. The probe Pr illustrated in FIG. 7 includes a tubular body 81 formed of a conductive material in a tubular shape, and a central conductor 91 formed of a conductive material in a rod shape.

A nickel or nickel alloy tube having an outer diameter of approximately 25 to 300 μm and an inner diameter of approximately 10 to 250 μm, for example, can be used to form the tubular body 81. The tubular body 81 may be configured to have, for example, an outer diameter of approximately 120 μm, an inner diameter of approximately 100 μm, and a total length of approximately 1700 μm. In addition, an inner circumference of the tubular body 81 may be coated with a plating layer such as a gold plating layer, and the circumferential surface of the tubular body 81 may be coated with an insulating coating as necessary.

A first opening portion 83 is provided at the tip portion of the tubular body 81, and a second opening portion 84 is provided at the rear end portion of the tubular body 81. A clasping portion Pd which holds the projection portion Ea of the electrode E to wrap around the projection portion is formed at the rear end portion of the tubular body 81. In addition, a spring portion Pe which expands and contracts in the axial direction of the tubular body 81 is formed over a predetermined length in the vicinity of the central portion of the tubular body 81.

For example, a laser beam is emitted from a laser beam machine (not illustrated) onto a circumferential wall of the tubular body 81 to form a helical groove Pg1 in the circumferential wall of the tubular body 81, thereby forming the spring portion Pe including a helical body extending in a helical shape along the circumferential surface of the tubular body 81. In addition, the tubular body 81 is configured to be capable of expanding and contracting in the axial direction thereof through compression-deformation of the spring portion Pe.

Note that the spring portion Pe having a helical body may be provided by, for example, performing etching on the circumferential wall of the tubular body 81 to form the helical groove Pg1. The spring portion Pe can also be provided by forming the helical groove Pg1 in the circumferential wall of the tubular body 81 by electroforming, for example. A tip-side cylindrical portion 85 and a rear end-side cylindrical portion 86 in which no spring (helical groove) is formed are provided on both sides of the spring portion Pe, and the clasping portion Pd is connected to the rear-end-side cylindrical portion 86.

Figure 8:
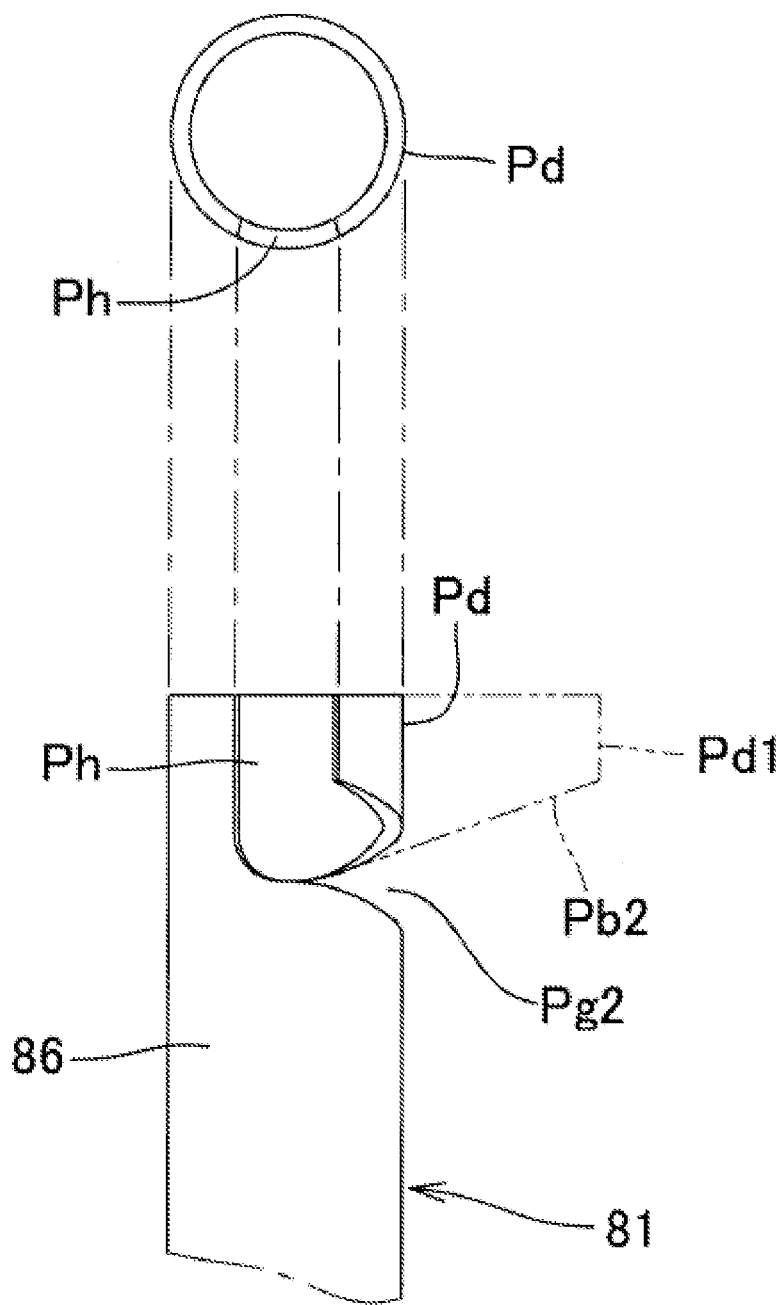
FIG. 8 illustrates a plan view and a front view of a clasping portion Pd connected to a rear end-side cylindrical portion 86.

Referring to FIG. 8, the clasping portion Pd is configured by the circumferential wall of the tubular body 81 in which a part is divided by a slit Ph having a predetermined length extending substantially parallel to the axial direction from the rear end portion of the tubular body 81.

The slit Ph communicates with the helical groove Pg2. The helical groove Pg2 can be formed in the same manner as the helical groove Pg1. The helical groove Pg2 is formed to have, for example, approximately half the circumference of the tubular body 81. Note that instead of the helical groove Pg2, a groove formed to have substantially a half circumference in a direction substantially orthogonal to the axial direction may be used, or only the slit Ph may be formed without the helical groove Pg2. Alternatively, the slit Ph may not be formed in the tubular body 81.

As illustrated by a broken line in FIG. 8, a clasping portion Pd in a developed state has a trapezoidal shape, including a tip surface Pd1 corresponding to one side of the slit Ph and a slanting surface Pd2 corresponding to one side of the helical groove Pg2. The clasping portion having the trapezoidal shape is bent into an arc shape to form the clasping portion Pd in the shape of a C-shaped retaining ring, including a cut portion having a predetermined width, with a portion of the circumferential wall of the tubular body 81.

In a state where the projection portion Ea of the electrode E is not inserted into the clasping portion Pd (tubular body 81), the outer diameter of the projection portion Ea of the electrode E is set larger than the inner diameter of the clasping portion Pd, that is, the inner diameter of the second opening portion 84. As a result, when the jig head 5 is assembled to the base portion 3 and the cover member 4 by inserting the projection portion Ea into the clasping portion Pd (tubular body 81), the projection portion Ea pushes out the inner circumference of the clasping portion Pd. In this manner, the projection portion Ea is press-fitted into the clasping portion Pd.

In a state where clasping portion Pd is crimped to the peripheral surface of the projection portion Ea, the clasping portion Pd holds the projection portion Ea to wrap around the projection portion, thereby maintaining a state where the probe Pr is assembled to the electrode E.

Here, the steps F and G of the step portions 71, 72, and 73 are made substantially equal to the thicknesses of the wiring substrates 21, 22, and 23, and thus as described above, the surface of the wiring substrate of the outermost surface is positioned in the same plane, and the electrodes E of the electrode regions A1, A2, and A3 are also positioned in the same plane. As a result, all the electrodes E can be easily connected to respective probes Pr.

Since the electrodes E are positioned in the same plane, the amount of compression of the spring portion Pe in each probe Pr when the electrodes E are connected to respective probes Pr is made uniform. As a result, when the tip portion 92 of the probe Pr is brought into contact with the inspection point 101 for inspection, the contact pressure between each probe Pr and each inspection point 101 can be made uniform. As a result, the stability of the inspection is improved, and the reliability of the inspection result is improved.

Referring to FIG. 6, the central conductor 91 is configured to be insertable into the tubular body 81 by setting the outer diameter of the central conductor slightly smaller than the inner diameter of the tubular body 81. The entire length of the central conductor 91 is set to be longer than the formation range of the spring portion Pe of the tubular body 81, so that the tip portion of the central conductor 91 is configured to be inserted into the rear end-side cylindrical portion 86.

A difference between the inner diameter of the tubular body 81 and the outer diameter of the central conductor 91 is set to be small. In this manner, when an inspection to described later is performed in a state where the central conductor 91 is assembled to the tubular body 81, the rear end-side cylindrical portion 86 of the tubular body 81 and the central conductor 91 come into slidable contact with each other and are electrically conducted.

A tapered portion having a tapered tip is formed at the tip portion 92 of the central conductor 91, and the tip portion 92 comes into contact with the inspection point 101, such as a pad or a bump, of the inspection target at the time of inspecting the inspection target 100 or the like to be described later.

The outer diameter of the central conductor 91 is formed to be smaller than the inner diameter of the small diameter portion Hb, so that the central conductor is inserted into the small diameter portion Hb. In addition, the tip-side cylindrical portion 85 and the central conductor 91 are fixed by a fixing means such as welding or caulking such that the tip portion 92 protrudes from the small diameter portion Hb to the outside of the support member 51 in a state where the probe Pr is supported by the support member 51.

The inner diameter of the small diameter portion Hb is smaller than the outer diameter of the tubular body 81. In this manner, the end portion of the tip-side cylindrical portion 85 comes into contact with the support plate 51a, and the biasing force of the spring portion Pe is received by the support plate 51a.

In the probe Pr illustrated in FIG. 6, when the tip portion 92 comes into contact with the inspection point 101 at the time of inspection, the tip portion 92 is pushed into the small diameter portion Hb against the biasing force of the spring portion Pe by the pressing force. As a result, the probe Pr can be brought into elastic contact with the inspection point 101 with an appropriate pressing force by the biasing force of the spring portion Pe. As a result, a contact stability between the probe Pr and the inspection point 101 can be improved.

Note that the probe Pr is not necessarily limited to one including the helical spring portion Pe. For example, a configuration may be made in which the probe Pr having a substantially rod shape is bent to generate an elastic pressing force. In addition, the probe Pr does not necessarily generate an elastic pressing force.

Figure 12:
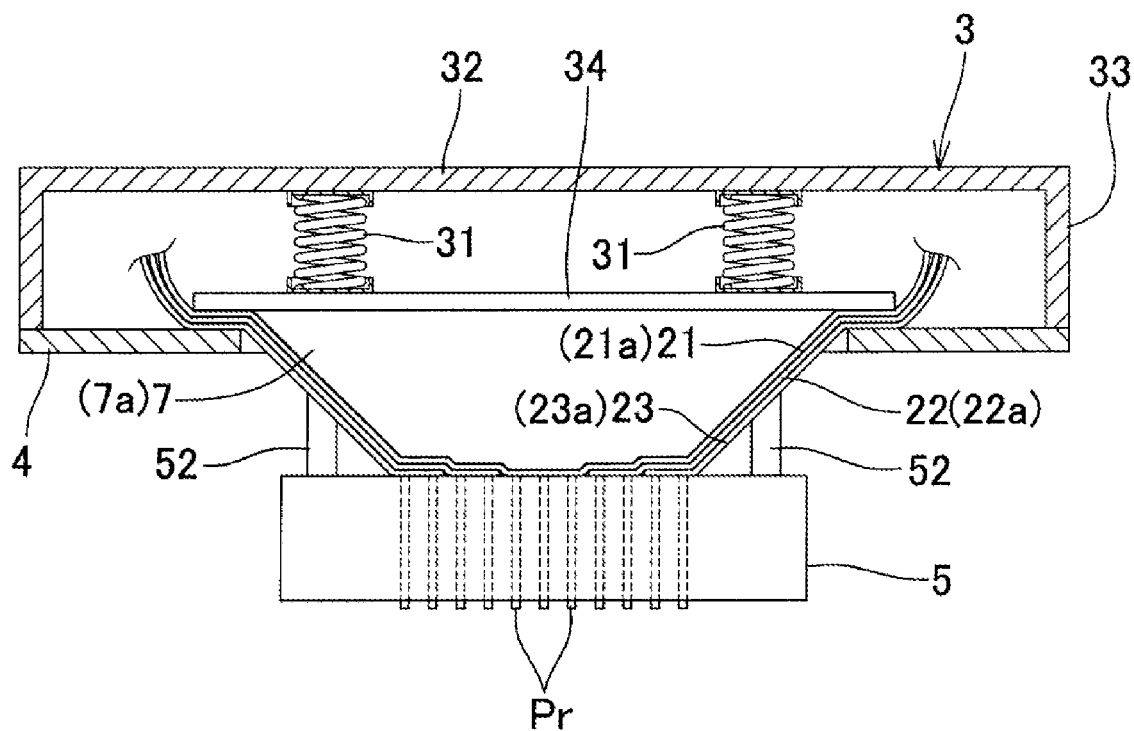
FIG. 12 is a cross-sectional view illustrating an example of an internal structure of a base portion illustrated in FIG. 2.

The base portion 3 illustrated in FIG. 12 has a container-shaped form including a bottom plate 32 and a wall portion 33 extending from the outer edge of the bottom plate 32, and the opening portion is closed by the cover member 4. In the internal space of the base portion 3, springs 31 and 31 (biasing members) each having one end fixed to the bottom plate 32, and a plate 34 supported by the springs 31 and 31 are accommodated.

The pedestal 7 or a pedestal 7a is fixed to the lower surface of the plate 34, and the lower surface thereof are attached with the wiring substrates 21 to 23 or wiring substrates 21a to 23a.

In this manner, the pedestal 7, 7a is supported by the springs 31 and 31, and thus when the jig head 5 is pressed against the inspection target 100 for inspection, the inspection target can be elastically pressed, and the pressing force can be appropriately adjusted by the springs 31 and 31.

Note that the inspection jig 2 may not include the springs 31 and 31, and the pedestal 7, 7a may be fixedly fixed to the bottom plate 32.

The inspection processing portion 11 includes, for example, a power supply circuit, a voltmeter, an ammeter, a microcomputer, and so on. The inspection processing portion 11 controls a driving mechanism (not illustrated) to move and position the inspection jig 2, and brings each of the probes Pr into contact with each inspection point 101 on the inspection target 100.

The inspection processing portion 11 is conductively connected to each probe Pr via the wiring substrates 21 to 23 or the wiring substrates 21a to 23a. In this manner, the inspection points 101 in contact with respective probes Pr are electrically connected to the inspection processing portion 11.

The inspection processing portion 11 is configured to supply an inspection electric current or voltage to each inspection point 101 in the inspection target 100 through each of the probes Pr of the inspection jig 2, and executes inspection of the inspection target 100 such as a disconnection, a short circuit, and a resistance measurement of a circuit pattern on the basis of a voltage signal or a current signal obtained from each probe Pr. Alternatively, the inspection processing portion 11 may supply AC current or voltage to each inspection point 101, so as to measure an impedance of the inspection target on the basis of the voltage signal or the current signal obtained from each probe Pr.

Figure 9:
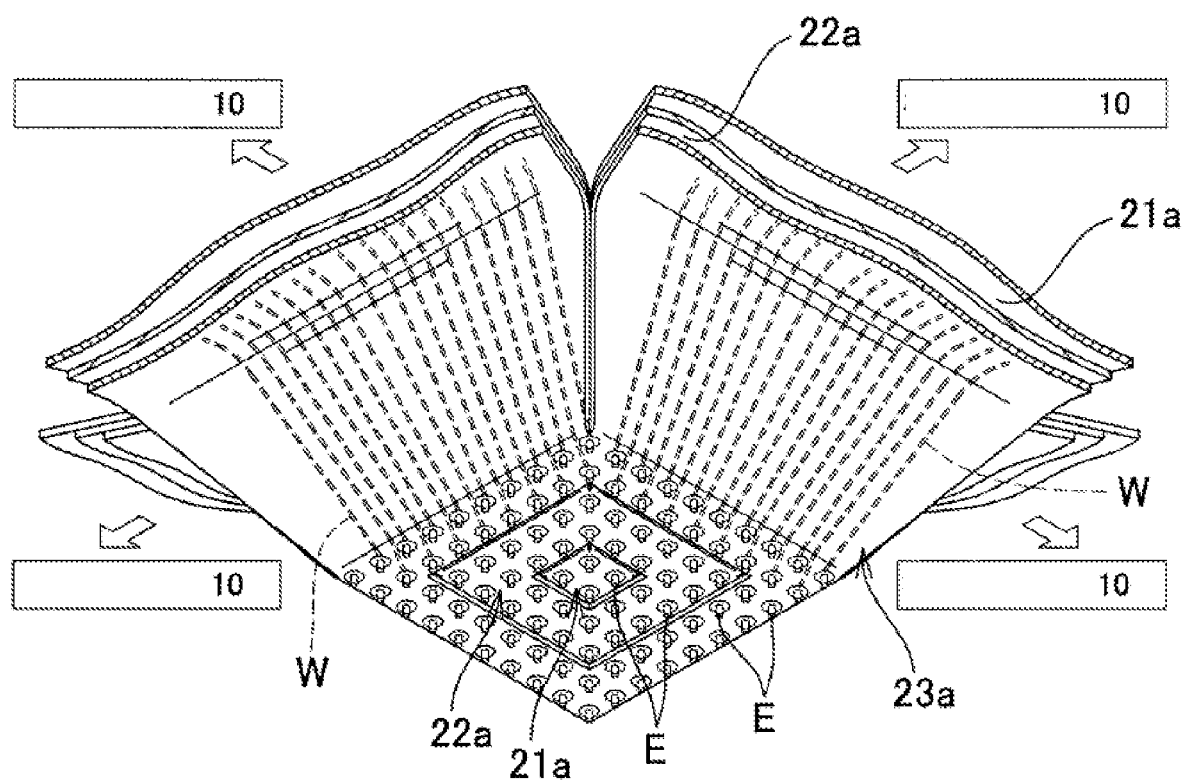
FIG. 9 is a perspective view illustrating a modification of the pedestal and the wiring substrate illustrated in FIG. 3.
Figure 10:
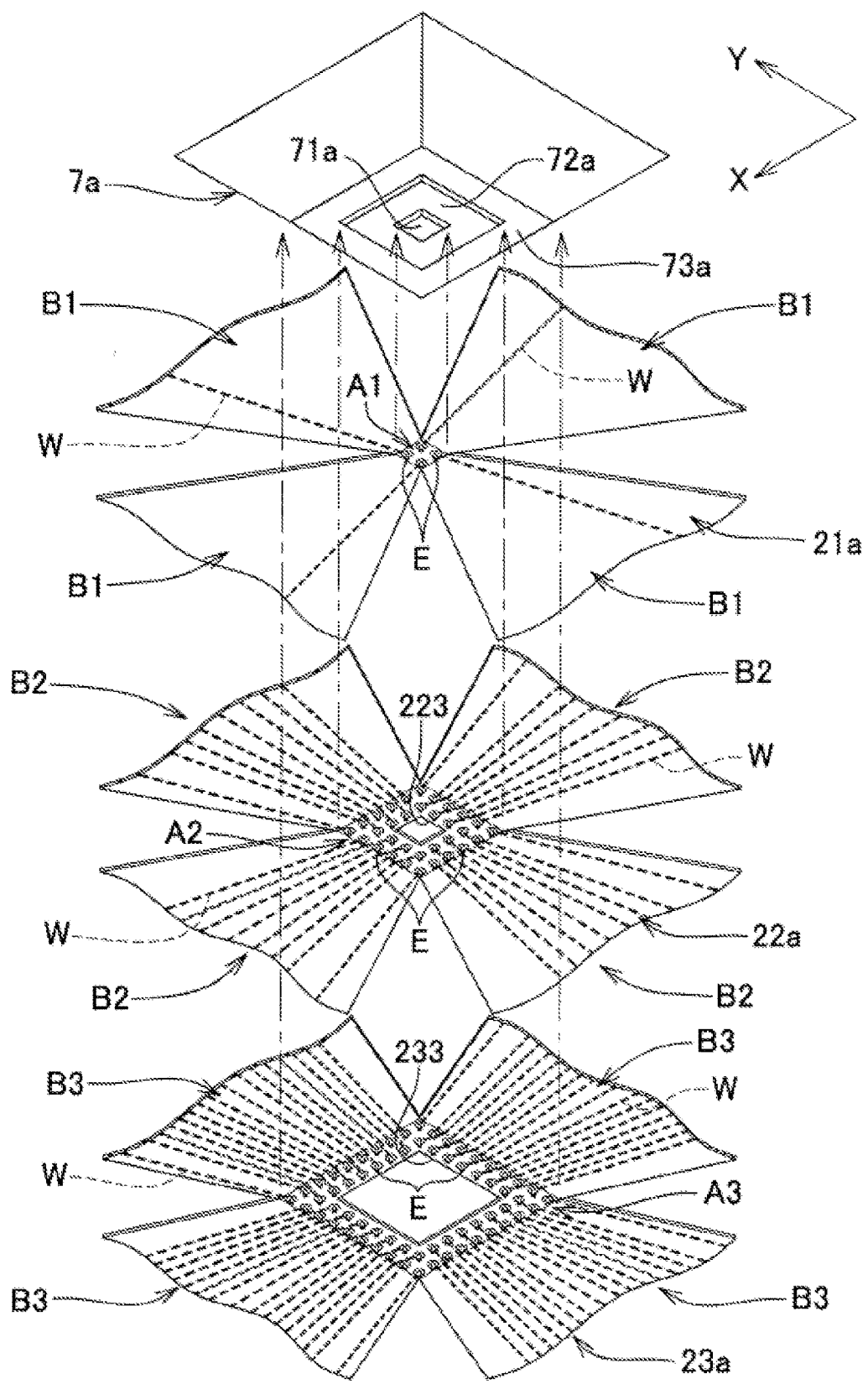
FIG. 10 is an exploded perspective view of the pedestal and the wiring substrate illustrated in FIG. 9.

FIG. 9 is a perspective view illustrating a modification of the pedestal and the wiring substrate illustrated in FIG. 3. In addition, FIG. 10 is an exploded perspective view of the pedestal and the wiring substrate illustrated in FIG. 9. Referring to FIGS. 9 and 10, the pedestal 7a has step portions 71a, 72a, and 73a formed in a so-called pyramid shape.

That is, in the pedestal 7a, the step portions 71a, 72a, and 73a are formed to protrude inward from both sides along both an X-axis direction (first direction) and the Y-axis direction (second direction) orthogonal to the X-axis direction. The wiring substrates 21a, 22a, and 23a are laminated on the lower surface of the pedestal 7a. The wiring substrates 21a, 22a, and 23a are so-called flexible substrates having a flexible film shape in which insulating layers and a wiring layer similar to those of the wiring substrates 21, 22, and 23 are laminated.

The lowermost wiring substrate 21a of the wiring substrates 21a, 22a, and 23a includes the electrode region A1 attached to the step portion 71a of the apex portion at the uppermost stage of the pedestal 7a and a wiring region B1 radially extending in four directions from the electrode region A1.

The wiring substrate 22a of the second layer from the bottom among the wiring substrates 21a, 22a, and 23a includes an opening portion 223 that exposes the electrode region A1 of the wiring substrate 21a positioned at the uppermost stage of the pedestal 7a, the electrode region A2 provided at the peripheral edge portion of the opening portion 223, and a wiring region B2 radially extending in four directions from the electrode region A2.

The wiring substrate 23a includes the opening portion 233 through which the electrode region A2 of the wiring substrate 22a positioned at the step portion 72a of the pedestal 7a is exposed, an electrode region A3 provided at the peripheral edge portion of the opening portion 233, and a wiring region B3 radially extending in four directions from the electrode region A3.

In the wiring regions B1, B2, and B3, the wires W connected to the respective electrodes E formed in the electrode regions A1, A2, and A3 are formed. The wires W in the wiring regions B1, B2, and B3 are formed to spread radially. The end portions of the wiring regions B1, B2, and B3 are connected to the inspection device body 10. Note that FIGS. 9 and 10 illustrate an example in which the electrodes E are arranged in a lattice pattern, but the electrodes E may be arranged in a staggered arrangement or in another arrangement.

The wires W connected to respective electrodes E of the wiring substrates 21a, 22a, and 23a are connected to the inspection device body 10 with the interval between the wires expanded from the interval between the electrodes E. Since the wiring substrates 21a, 22a, and 23a are film-shaped, so-called flexible substrates, it is easy to expand the wiring interval similarly to the wiring substrates 21, 22, and 23.

In addition, the wiring regions B1, B2, and B3 radially extend in four directions, and thus it is easy to make the substrate areas larger than those of the wiring substrates 21, 22, and 23. As a result, compared with the wiring substrates 21, 22, and 23, it is easier to expand the wiring interval in the wiring substrates 21a, 22a, and 23a.

By using the pedestal 7a and the wiring substrates 21a, 22a, and 23a, similarly to the case of using the pedestal 7 and the wiring substrates 21, 22, and 23, it is easy to reduce the adjacent interval of the electrodes E and increase the number of the electrodes E.

The pedestal 7a and the wiring substrates 21a, 22a, and 23a may be used instead of the pedestal 7 and the wiring substrates 21, 22, and 23 illustrated in FIGS. 1 to 4 and 6.

Figure 11:
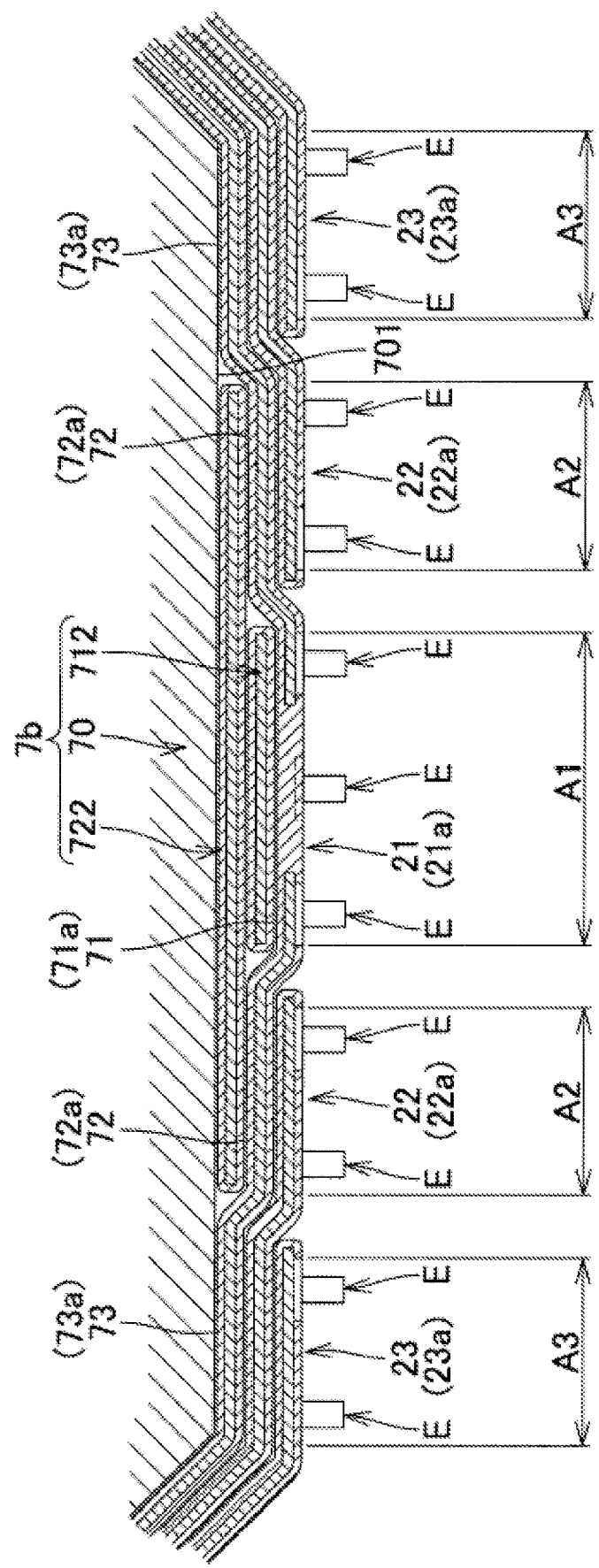
FIG. 11 is a cross-sectional view illustrating a modification of the pedestal 7, 7a illustrated in FIG. 4.

The pedestal 7b illustrated in FIG. 11 is different from the pedestal 7, 7a illustrated in FIG. 4 in that the step portions 71 and 72 or the step portions 71a and 72a are configured by step substrates 712 and 722. Specifically, the pedestal 7b includes a base material 70 having a flat base material surface 701 on the lower surface, the step substrate 712 having a size substantially equal to the electrode region A1, and the step substrate 722 slightly larger than a size obtained by adding twice the electrode region A2 to the electrode region A1.

The thickness of the step substrates 712 and 722 is substantially equal to the thickness of the wiring substrates 21, 22, and 23 or the wiring substrates 21a, 22a, and 23a. That is, each of the step substrates 712 and 722 is provided as a sheet member having substantially the same thickness as each of the wiring substrates 21a, 22a, and 23a. In addition, each of the step substrate 712 and 722 has a structure in which a wiring layer (first layer) and insulating layers (second layer) having the same material and thickness as those of the wiring substrates 21 to 23 and 21a to 23a are laminated similarly to the wiring substrates 21 to 23 and 21a to 23a. In addition, the step substrate 722 is attached to the base material surface 701 with an adhesive, and the step substrate 712 is attached to a substantially central portion of the lower surface of the step substrate 722 with an adhesive.

The lower surface of the step substrate 712 serves as the step portion 71 or the step portion 71a, a portion of the lower surface of the step substrate 722 to which the step substrate 712 is not attached serves as the step portion 72 or the step portion 72 a, and both sides of the step substrate 722 on the base material surface 701 serve as the step portion 73 or the step portion 73a.

In the inspection jig 2, the step of the pedestal 7, 7a may be configured using the step substrates 712 and 722 as in the pedestal 7b illustrated in FIG. 11. According to the pedestal 7b, in the electrode region A1, an adhesive layer, the step substrate 722, an adhesive layer, the step substrate 712, an adhesive layer, and the wiring substrate 21 are laminated on the flat base material surface 701.

In the electrode region A2, an adhesive layer, a step substrate 722, an adhesive layer, a wiring substrate 21 (21a), an adhesive layer, and a wiring substrate 22 (22a) are laminated on the flat base material surface 701. In the electrode region A3, an adhesive layer, the wiring substrate 21 (21a), an adhesive layer, the wiring substrate (22a), an adhesive layer, and the wiring substrate 23 (23a) are laminated on the flat base material surface 701 (step portion 73).

In this case, in any of the electrode regions A1, A2, and A3, three substrates having the same thickness and material, and three adhesive layers are laminated. As a result, in any of the electrode regions A1, A2, and A3, the number of substrates and adhesive layers interposed between the electrode E and the base material surface 701 becomes equal, and the elasticity of the layer between the electrode E and the base material surface 701 is made uniform.

Since the pressing force from the probe Pr connected to the electrode E is received by the layer between the electrode E and the base material surface 701, the elasticity of this layer is made uniform, so that the elastic pressing force with which each probe Pr comes into contact with the inspection point 101 is made uniform. As a result, it is easy to improve the contact stability between the probe Pr and the inspection point 101.

The pedestal 7b does not require processing for forming the step portions 71 to 73 and 71a to 73a unlike the pedestal 7, 7a, and can be manufactured only by attaching the step substrates 712 and 722 to the base material 70 having a flat lower surface. In addition, since the step is formed by the thickness of the step substrates 712 and 722 having the same thickness as those of the wiring substrates 21 to 23, 21a to 23a, it is easy to improve the accuracy of the steps of the step portions 71 to 73 and 71a to 73a.

Therefore, the pedestal 7, 7a is more easily manufactured by using the step substrates 712 and 722 as in the pedestal 7b.

Note that the wiring substrates 21 to 23, 21a to 23a may be directly laminated on the flat base material surface 701 without using the step substrates 712 and 722. In this case, steps are made in the electrode regions A1, A2, and A3 by the thickness of the substrates. Therefore, the length of the probe Pr may be changed in order to absorb the steps.

That is, an inspection jig according to an exemplary embodiment of the present disclosure includes: a plurality of film-shaped wiring substrates each having one surface provided with an electrode; a pedestal that supports the plurality of wiring substrates which are laminated such that electrode regions are exposed, the electrode region being a region where the electrode is provided in each of the wiring substrates; and a plurality of probes which have base end portions in contact with the electrode regions and extend in a direction away from the electrode regions.

Further, the inspection device according to at least one exemplary embodiment of the present disclosure includes the inspection jig described above and an inspection processing portion that performs an inspection of an inspection target on the basis of an electrical signal obtained by bringing the probe into contact with an inspection point provided on the inspection target.

According to these configurations, the wire from the electrode in contact with the probe is drawn out by the film-shaped wiring substrate. At this time, in the film-shaped wiring substrate, it is easy to expand the wiring interval from the interval between the electrodes. Therefore, it is easy to expand the interval between the electrodes to be connected to the probes to an interval allowing the connection to the inspection device body.

Preferably, the plurality of wiring substrates have flexibility, step portions to be attached with the respective electrode regions are formed on the pedestal, and steps of the step portions correspond to thicknesses of the respective wiring substrates.

According to this configuration, the step portions of the steps corresponding to the thicknesses of respective wiring substrate are formed on the pedestal supporting the plurality of laminated wiring substrates. Since the electrode region of each film-shaped wiring substrate having flexibility is attached to the step portion, the surface of each electrode region becomes substantially flat. As a result, it is easy to position the electrodes in the same plane.

Preferably, in the step portions, the steps are formed to protrude inward from both sides along a predetermined first direction.

According to this configuration, the electrode regions can be made substantially flat in a state where the number of laminated wiring substrates increases toward the outside. Therefore, it is easy to laminate the plurality of wiring substrates to expose the electrode regions of the wiring substrates while shifting.

Preferably, the pedestal is further formed with the step portions such that the step portions protrude inward from both sides along a second direction orthogonal to the first direction.

According to this configuration, the electrode regions can be made substantially flat in a state where the number of laminated layers increases outward from the central portion in four directions. Therefore, it is easy to laminate the plurality of wiring substrates to expose the electrode regions of the wiring substrates while shifting. Furthermore, since the area in which wiring can be performed increases, it is easy to expand the interval between the wires.

Preferably, a lowermost wiring substrate among the plurality of laminated wiring substrates includes the electrode region attached to an apex portion at an uppermost stage of the pedestal and a wiring region radially extending from the electrode region in four directions, and a wiring substrate of a second layer from a bottom among the plurality of laminated wiring substrates includes an opening portion which exposes the electrode region of the lowermost wiring substrate covering the uppermost stage of the pedestal, the electrode region provided in a peripheral edge portion of the opening portion, and a wiring region radially extending from the electrode region in the four directions.

According to this configuration, each wiring substrate has the wiring region extending radially in the four directions, and thus it is easy to expand the wiring interval in each wiring region.

Preferably, the pedestal includes a substrate having a flat substrate surface, and a sheet member which is disposed on the base material surface to form the step portion and has substantially the same thickness as each of the wiring substrates.

According to this configuration, the step portion having the step corresponding to the thickness of each wiring substrate can be formed by attaching the sheet member to the flat base material surface, and thus the pedestal can be easily manufactured.

Preferably, each of the wiring substrates includes a wiring layer which is conducted with the electrode, and insulating layers which cover both surfaces of the wiring layer, and the sheet member includes a first layer made of the same material as the wiring layer, and second layers which cover both surfaces of the first layer and are made of the same material as the insulating layer.

According to this configuration, the layer structure interposed between the electrode and the base material surface is substantially the same between the electrode regions, and thus the elasticity in the holding state in which each electrode is held is made uniform.

Preferably, each of the probes includes a tube-shaped tubular body which has conductivity and has a first opening portion and a second opening portion at both ends and a rod-shaped central conductor which has conductivity and is inserted into the tubular body such that a tip portion protrudes from the first opening portion, the tubular body includes a spring portion which is helical along a circumferential surface, and each of the electrodes has a projection portion to be inserted into the second opening portion.

According to this configuration, each probe can elastically come into contact with the inspection target by the biasing force of the spring portion. As a result, the contact stability of the probe is improved. In addition, the projection portion of the electrode of each wiring substrate is inserted into the second opening portion of the tubular body configuring the probe, and thus the reliability of connection between the probe and the electrode is improved.

Preferably, the second opening portion is divided in a circumferential direction of the tubular body by a slit provided at an end portion of the tubular body and extending in an axial direction, and an outer diameter of the projection portion is larger than an inner diameter of the second opening portion in a state where the projection portion is not inserted.

According to this configuration, when the projection portion is inserted into the second opening portion, the diameter of the tubular body is increased by the slit, and thus the projection portion can be smoothly inserted into the second opening portion. Furthermore, the outer diameter of the projection portion is larger than the inner diameter of the second opening portion in a state where the projection portion is not inserted, and thus the protrusion is held by a restoring force of the tubular body trying to return to the original shape. As a result, it is easy to connect the probe and the electrode.

Preferably, the pedestal protrudes from a periphery of the pedestal.

According to this configuration, each electrode in the electrode region protrudes from a periphery of the electrode. Therefore, there is no interference around the electrode region, and thus it is easy to provide each probe extending in a direction away from the electrode region of each wiring substrate.

Preferably, the inspection jig further includes: a biasing member that biases the pedestal in a direction of the protruding.

According to this configuration, the probe extending in the direction away from the wiring substrate attached to the pedestal is biased toward the outermost surface side. As a result, when the probe is brought into contact with the inspection target, the inspection target can be elastically pressed, and thus the contact stability of the probe can be easily improved.

In the inspection jig having such a configuration and the inspection device, it is easy to expand the interval between the wires to be connected to the inspection device body from the interval between the electrodes to be connected to the probes.

This application is based on Japanese Patent Application No. 2019-155225 filed on Aug. 28, 2019, the content of which is included in the present application.

It should be noted that the specific embodiments or examples made in the modes for carrying out aspects of the present disclosure are merely for clarifying the technical contents of the present disclosure, and the present disclosure is not limited only to such specific examples. It should not be construed in a narrow sense by limiting only.

Features of the above-described embodiments and the modifications thereof may be combined appropriately as long as no conflict arises.

While certain embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An inspection jig comprising:
a plurality of film-shaped wiring substrates each having one surface provided with an electrode;
a pedestal that supports the plurality of wiring substrates which are laminated such that electrode regions are exposed, the electrode region being a region where the electrode is provided in each of the wiring substrates; and
a plurality of probes which have base end portions in contact with the electrode regions and extend in a direction away from the electrode regions; wherein
the plurality of wiring substrates have flexibility,
step portions to be attached with the respective electrode regions are formed on the pedestal, and
steps of the step portions correspond to thicknesses of the respective wiring substrates.

2. The inspection jig according to claim 1, wherein
in the step portions, the steps are formed to protrude inward from both sides along a predetermined first direction.

3. The inspection jig according to claim 2, wherein
the pedestal is further formed with the step portions such that the step portions protrude inward from both sides along a second direction orthogonal to the first direction.

4. The inspection jig according to claim 3, wherein
a lowermost wiring substrate among the plurality of laminated wiring substrates includes the electrode region attached to an apex portion at an uppermost stage of the pedestal and a wiring region radially extending from the electrode region in four directions, and
a wiring substrate of a second layer from a bottom among the plurality of laminated wiring substrates includes an opening portion which exposes the electrode region of the lowermost wiring substrate covering the uppermost stage of the pedestal,
the electrode region provided in a peripheral edge portion of the opening portion, and
a wiring region radially extending from the electrode region in the four directions.

5. The inspection jig according to claim 2, wherein
the pedestal protrudes from a periphery of the pedestal.

6. An inspection device comprising:
the inspection jig according to claim 2; and
an inspection processing portion that performs an inspection of an inspection target on a basis of an electrical signal obtained by bringing the probe into contact with an inspection point provided on the inspection target.

7. The inspection jig according to claim 3, wherein
the pedestal protrudes from a periphery of the pedestal.

8. An inspection device comprising:
the inspection jig according to claim 3; and
an inspection processing portion that performs an inspection of an inspection target on a basis of an electrical signal obtained by bringing the probe into contact with an inspection point provided on the inspection target.

9. The inspection jig according to claim 1, wherein
the pedestal includes
a substrate having a flat substrate surface, and
a sheet member which is disposed on the base material surface to form the step portion and has a substantially same thickness as each of the wiring substrates.

10. The inspection jig according to claim 9, wherein
each of the wiring substrates includes a wiring layer which is conducted with the electrode, and insulating layers which cover both surfaces of the wiring layer, and
the sheet member includes a first layer made of a same material as the wiring layer, and second layers which cover both surfaces of the first layer and are made of a same material as the insulating layer.

11. The inspection jig according to claim 1, wherein
each of the probes includes
a tube-shaped tubular body which has conductivity and has a first opening portion and a second opening portion at both ends, and
a rod-shaped central conductor which has conductivity and is inserted into the tubular body such that a tip portion protrudes from the first opening portion,
the tubular body includes a spring portion which is helical along a circumferential surface, and
each of the electrodes has a projection portion to be inserted into the second opening portion.

12. The inspection jig according to claim 11, wherein
the second opening portion is divided in a circumferential direction of the tubular body by a slit provided at an end portion of the tubular body and extending in an axial direction, and
an outer diameter of the projection portion is larger than an inner diameter of the second opening portion in a state where the projection portion is not inserted.

13. An inspection device comprising:
the inspection jig according to claim 11; and
an inspection processing portion that performs an inspection of an inspection target on a basis of an electrical signal obtained by bringing the probe into contact with an inspection point provided on the inspection target.

14. An inspection device comprising:
the inspection jig according to claim 1; and
an inspection processing portion that performs an inspection of an inspection target on a basis of an electrical signal obtained by bringing the probe into contact with an inspection point provided on the inspection target.

15. The inspection jig according to claim 1, wherein
the pedestal protrudes from a periphery of the pedestal.

16. An inspection jig comprising:
a plurality of film-shaped wiring substrates each having one surface provided with an electrode;
a pedestal that supports the plurality of wiring substrates which are laminated such that electrode regions are exposed, the electrode region being a region where the electrode is provided in each of the wiring substrates; and
a plurality of probes which have base end portions in contact with the electrode regions and extend in a direction away from the electrode regions;
wherein the pedestal protrudes from a periphery of the pedestal.

17. The inspection jig according to claim 16, further comprising:
a biasing member that biases the pedestal in a direction of the protruding.

18. An inspection device comprising:
the inspection jig according to claim 16; and
an inspection processing portion that performs an inspection of an inspection target on a basis of an electrical signal obtained by bringing the probe into contact with an inspection point provided on the inspection target.

19. The inspection jig according to claim 16, wherein
each of the probes includes
a tube-shaped tubular body which has conductivity and has a first opening portion and a second opening portion at both ends, and
a rod-shaped central conductor which has conductivity and is inserted into the tubular body such that a tip portion protrudes from the first opening portion,
the tubular body includes a spring portion which is helical along a circumferential surface, and
each of the electrodes has a projection portion to be inserted into the second opening portion.

20. An inspection device comprising:
the inspection jig according to claim 19; and
an inspection processing portion that performs an inspection of an inspection target on a basis of an electrical signal obtained by bringing the probe into contact with an inspection point provided on the inspection target.

* * * * *

UNITED STATES PATENT AND TRADEMARK OFFICE
CERTIFICATE OF CORRECTION

| | | |
|---|---|---|
| PATENT NO. | : 12,072,352 B2 | Page 1 of 1 |
| APPLICATION NO. | : 17/636901 | |
| DATED | : August 27, 2024 | |
| INVENTOR(S) | : Michio Kaida | |

It is certified that error appears in the above-identified patent and that said Letters Patent is hereby corrected as shown below:

On the Title Page

Please change:
(22) PCT Filed from "Aug. 8, 2020" to --Aug. 27 2020--

Signed and Sealed this
Twenty-eighth Day of October, 2025

John A. Squires
*Director of the United States Patent and Trademark Office*